(12) United States Patent
Ravimohan et al.

(10) Patent No.: US 9,978,462 B2
(45) Date of Patent: May 22, 2018

(54) PARTIAL SOFT BIT READ

(71) Applicant: SANDISK TECHNOLOGIES INC., Plano, TX (US)

(72) Inventors: Narendhiran Chinnaanangur Ravimohan, Bangalore (IN); Muralitharan Jayaraman, Bangalore (IN); Abhijeet Manohar, Bangalore (IN); Idan Alrod, Herzeliya (IL)

(73) Assignee: SanDisk Technologies LLC, Plano, TX (US)

( * ) Notice: Subject to any disclaimer, the term of this patent is extended or adjusted under 35 U.S.C. 154(b) by 114 days.

(21) Appl. No.: 14/927,088

(22) Filed: Oct. 29, 2015

(65) Prior Publication Data

US 2017/0123902 A1    May 4, 2017

(51) Int. Cl.
*G11C 29/52* (2006.01)
*H03M 13/11* (2006.01)
*G06F 11/10* (2006.01)
*G11C 11/56* (2006.01)
*G11C 29/04* (2006.01)

(52) U.S. Cl.
CPC .......... *G11C 29/52* (2013.01); *G06F 11/1012* (2013.01); *G06F 11/1068* (2013.01); *G11C 11/5642* (2013.01); *H03M 13/1102* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 8,042,029 B2 | 10/2011 | Alrod et al. | |
| 8,918,705 B1* | 12/2014 | Tang | H03M 13/3927 714/763 |
| 2008/0244338 A1* | 10/2008 | Mokhlesi | G06F 11/1068 714/702 |
| 2009/0177931 A1 | 7/2009 | Song et al. | |
| 2009/0235129 A1 | 9/2009 | Eun et al. | |
| 2010/0058125 A1 | 3/2010 | Chen et al. | |
| 2011/0320902 A1 | 12/2011 | Gunnam | |
| 2013/0024605 A1 | 1/2013 | Sharon et al. | |
| 2013/0111309 A1* | 5/2013 | Zhang | H03M 13/1111 714/807 |
| 2013/0145229 A1 | 6/2013 | Frayer et al. | |

(Continued)

OTHER PUBLICATIONS

Ryabinin, Y. et al., "Storage Device Operations Based on Bit Error Rate (BER) Estimate", U.S. Appl. No. 14/925,676, filed Oct. 28, 2015, 37 pages.

(Continued)

*Primary Examiner* — Steve Nguyen
(74) *Attorney, Agent, or Firm* — Toler Law Group, PC (57) ABSTRACT

A data storage device includes a non-volatile memory and a controller coupled to the non-volatile memory. The controller includes an error correction coding (ECC) decoder. The non-volatile memory is configured to sense hard bit data and soft bit data corresponding to multiple ECC codewords from a word line of the non-volatile memory and to sense soft bit data for the multiple ECC codewords. The soft bit data includes sub codes for each of the multiple ECC codewords. The non-volatile memory is configured to send less than all of the sensed soft bit sub codes to the ECC decoder.

21 Claims, 7 Drawing Sheets

(56) References Cited

U.S. PATENT DOCUMENTS

| | | |
|---|---|---|
| 2013/0166988 A1 | 6/2013 | Sharon et al. |
| 2013/0198591 A1* | 8/2013 | Kamuf .................. H04L 1/1861 |
| | | 714/780 |
| 2014/0153331 A1* | 6/2014 | Jang ..................... G11C 7/1039 |
| | | 365/185.03 |
| 2014/0237315 A1* | 8/2014 | Fitzpatrick ........ H03M 13/2909 |
| | | 714/755 |
| 2015/0089330 A1* | 3/2015 | Xia ..................... G06F 11/1008 |
| | | 714/773 |
| 2015/0169406 A1 | 6/2015 | Li et al. |
| 2015/0188570 A1 | 7/2015 | Kwok et al. |
| 2015/0286528 A1 | 10/2015 | Cai et al. |
| 2016/0218740 A1 | 7/2016 | Parthasarathy et al. |
| 2016/0246603 A1* | 8/2016 | Watanabe ............ G06F 9/30145 |
| 2017/0097859 A1 | 4/2017 | Parthasarathy et al. |
| 2017/0123900 A1* | 5/2017 | Zhao .................. G06F 11/1068 |

OTHER PUBLICATIONS

Conley et al., U.S. Appl. No. 14/563,820 entitled, "Rewritable Multibit Non-Volatile Memory with Soft Decode Optimization," filed Dec. 8, 2014, 74 pages.

\* cited by examiner

PARTIAL SOFT BIT READ

FIELD OF THE DISCLOSURE

The present disclosure is generally related to a partial soft bit read operation.

BACKGROUND

Low-density parity-check (LDPC) is a type of error correction coding (ECC) mechanism that can be performed by a storage device. LDPC ECC engines often support a soft bit page read mode. In the soft bit page read mode, data is read from a page of memory that stores ECC parity information. The LDPC ECC engine may request a soft bit page read if the data read from the page is expected to be erroneous. During the soft bit page read, data from the page is sensed using an additional set of threshold voltages. The sensed data may then be "toggled out" (e.g., transferred) from the memory to the LDPC ECC engine. The soft bit page read operation may provide the LDPC ECC engine with an indication as to which memory cells have a high probability of being erroneous. Such information may improve decoding performance of the LDPC ECC engine. However, performing the additional sensing and toggle operations for the soft bit page read may decrease overall throughput at the storage device. This performance impact may particularly affect systems that use a low frequency/bandwidth bus between the memory and the LDPC ECC engine.

DETAILED DESCRIPTION

Particular aspects of the disclosure are described below with reference to the drawings. In the description, common features are designated by common reference numbers. As used herein, "examplary" may indicate an example, an implementation, and/or an aspect, and should not be construed as limiting or as indicating a preference or a preferred implementation.

The present disclosure describes a "partial" soft bit read operation in which some, rather than all, soft bit data is transferred from a memory (e.g., a NAND flash memory) to a controller that includes an ECC engine, such as an LDPC ECC engine. To illustrate, hard bit data for a specified word line in the memory may initially be determined and provided to the controller. The hard bit data may be determined by sensing cells of a word line using state threshold(s) (e.g., an A state threshold, a B state threshold, etc.). The LDPC ECC engine may determine a syndrome weight based on the hard bit data. If the syndrome weight exceeds a threshold, a partial soft bit read operation may be performed. The partial soft bit read operation may include a sense operation and a toggle out operation. During the sense operation, soft bit data for the cells of the word line may be sensed, in parallel, and stored into latches. During the toggle out operation, a portion of the soft bit data is transferred from the latches to random access memory (RAM) of the controller (and then provided to the ECC engine for use in decoding). By transferring less than all of the soft bits, throughput of the data storage device is increased.

The present disclosure describes several options for selecting the portion of soft bit information that is transferred from the latches to the controller RAM. According to a first option, all soft bit information is provided for some ECC codewords in the word line, and no soft bit information is provided for other ECC codewords in the word line. To illustrate, a word line may include 32 ECC codewords, where each ECC codeword can be divided into 4 sub codes. As each memory cell of the word line generates one soft bit, the soft bit data for each ECC codeword may also be divided into 4 sub codes. As used herein, a "sub code" represents a decoding granularity of the ECC engine. When an ECC codeword is divided into four sub codes, each of the sub codes may include (or may be stored along with) parity information for the sub code. Joint parity information for all four sub codes may also be included in (or may be stored along with) the ECC codeword. According to the first option, all 4 sub codes (of soft bit data) are transferred for some of the ECC codewords, and no sub codes are transferred for the rest of the ECC codewords. In one example, all sub codes are transferred for half of the ECC codewords (e.g., codewords 1-16), and no sub codes are transferred for the other half of the ECC codewords (e.g., codewords 17-32). The split between ECC codewords for which all/no sub codes are transferred may be 25%-75%, 75%-25%, etc., instead of 50%-50%.

According to a second option, some but not all sub codes (of soft bit data) are transferred for each of the ECC codewords. For example, 2 out of 4 sub codes may be transferred for each of the 32 ECC codewords. In alternative implementations, 1 out of 4 sub codes, 3 out of 4 sub codes, or some other number of sub codes may be transferred for each ECC codeword. It is to be understood that additional options may be used without departing from the scope of the present disclosure. In another example, some but not all sub codes (of soft bit data) may be transferred for some but not all ECC codewords. Thus, it is to be understood that the disclosed partial soft bit read operation includes any option in which at least one soft bit is not sent to the controller.

Figure 1:
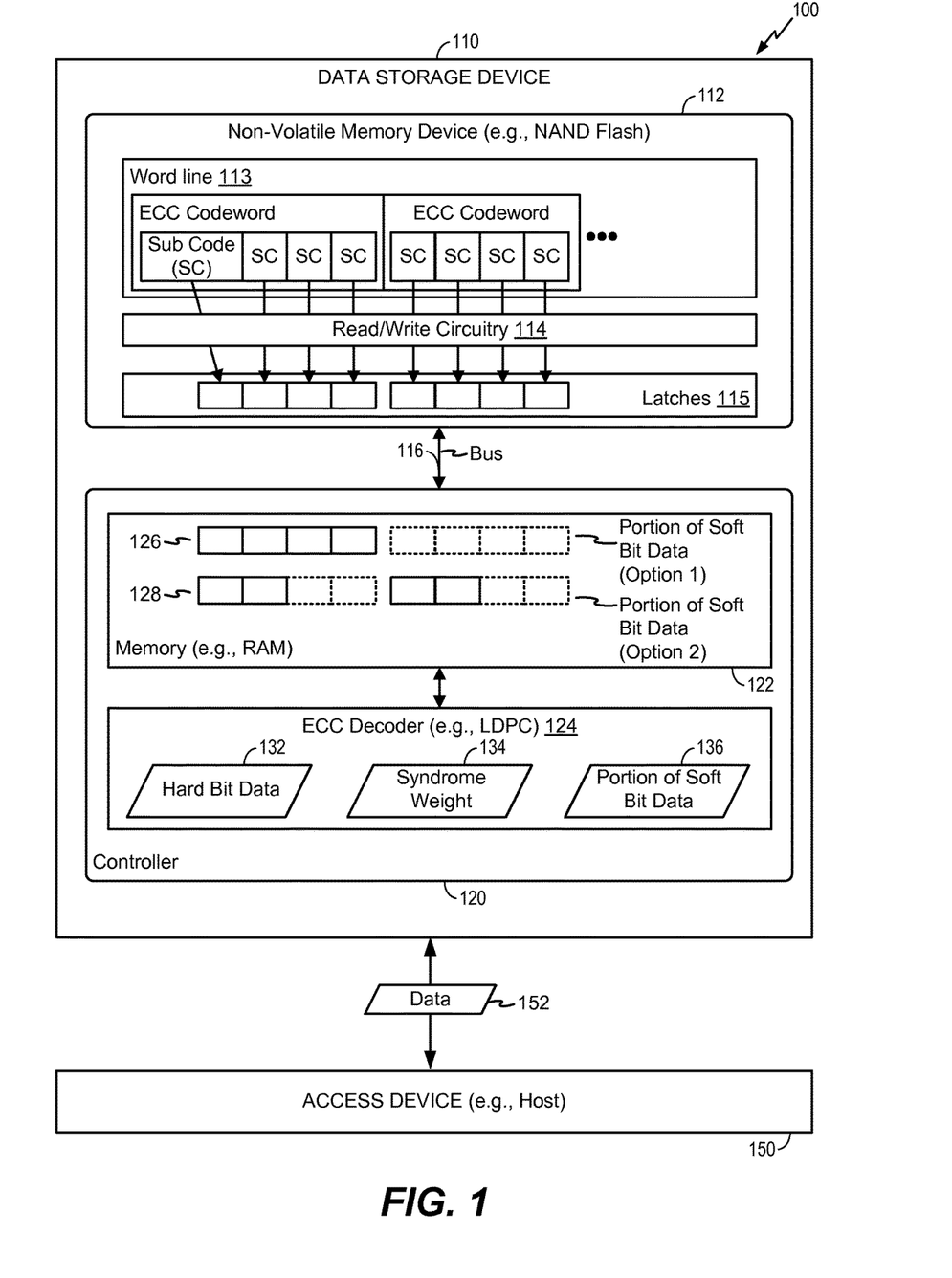
FIG. 1 is a diagram of a particular illustrative example of a system that includes a data storage device configured to perform a partial soft bit read operation.

Referring to FIG. 1, a particular illustrative example of a system is depicted and generally designated 100. The system 100 includes a data storage device 110 and an access device 150 (e.g., a host device). The data storage device 110 includes a controller 120 and a non-volatile memory device 112, which may correspond to one or more memory dies. The memory dies may collectively represent a memory. In an illustrative example, the memory includes a flash memory (e.g., a NAND flash memory) or a resistive random access memory (ReRAM).

The controller 120 may be coupled to the access device 150 via a first interface and to the memory device 112 via a second interface. The first interface may be an access device (e.g., host) interface, such as a small computer system interface (SCSI), a Fibre Channel, a peripheral component interconnect express (PCIe), and/or a non-volatile memory express (NVMe) interface. In some examples, the data storage device 110 may include or correspond to a solid-state drive (SSD) that is accessible via NVMe protocol(s). The first interface may facilitate transfer for data, control signals, timing signals, and/or power transfer between the access device 150 and the data storage device 110.

In a particular aspect, the memory device 112 may include storage cells that are arranged in a plurality of word lines. Each word line, such as an illustrative word line 113 in FIG. 1, may be present on a single die or may span multiple dies of the memory device 112. The word line 113 may store a plurality of ECC codewords, which may alternatively be referred to as an ECC block. In a particular aspect, an ECC codeword may include header information, seed information, data, flags, cyclic redundancy check (CRC) or parity information, or any combination thereof. In a particular example, an ECC codeword may be 2 kilobytes (KB) or 4 KB in length, and may be divided into multiple sub codes (SCs). In FIG. 1, each ECC codeword is divided into four sub codes, which may be 512 bytes or 1 KB in length. In alternative examples, ECC codewords may be divided into a different number of sub codes, sub codes may have different lengths, or both.

The memory device may also include read/write circuitry 114 and latches 115. In some examples, read/write circuitry 114 and latches 115 are provided around the memory device 112 in symmetrical fashion (e.g., on opposite sides of a memory array), so that densities of access lines and circuitry on each side can be reduced (e.g., by half). Alternatively, the read/write circuitry 114 and latches 115 can be laid out in non-symmetric fashion with respect to the memory device 112, as shown in FIG. 1. According to a particular aspect, the read/write circuitry 114 includes multiple sense blocks to enable a page of storage elements (e.g., memory cells) to be read or written in parallel based on row/column addressing. In one example, each storage element (e.g., memory cell) stores one bit of data for an upper page, one bit of data for a middle page, and one bit of data for a lower page, as further described with reference to FIG. 2.

During a read operation, the read/write circuitry 114 may sense data values stored in memory cells of one or more word lines based on a comparison to one or more thresholds. Examples of sense thresholds are further described with reference to FIG. 2. The sensed data values for each cell of a word line, such as the word line 113, may be stored in the latches 115. For example, as shown in FIG. 1, sensed bits corresponding to all sub codes of all ECC codewords of the word line 113 may be stored in the latches 115. Depending on the threshold(s) used during the sense operation, the bits stored in the latches 115 may be hard bits or soft bits, as further described with reference to FIG. 2.

The controller 120 may include a memory 122 and a decoder 124. In an illustrative example, the memory 122 is a random access memory (RAM) that is configured to communicate with the latches 115 of the memory device 112 via a bus 116. In some aspects, the bus 116 may have a toggle mode frequency that represents how often data from the latches 115 is (or can be) transferred to the memory 122 via the bus 116. As further described herein, the present disclosure describes a partial soft bit read operation in which some, but not all, of the soft bit information stored in the latches 115 is transferred to the memory 122 via the bus 116.

The decoder 124 may include a LDPC ECC decoding engine that is configured to decode data read from the memory device 112 based on LDPC decoding principles. To illustrate, during a read operation, the decoder 124 may be configured to decode data stored in the word line 113 based on hard bit data (e.g., one or more hard bits sensed from the word line 113), soft bit data (e.g., one or more soft bits sensed from the word line 113), or both. In some examples, during the decoding process, the decoder 124 determines a syndrome weight 134 corresponding to the word line 113 (or portion thereof, such as a single ECC codeword or a single code word). As further described herein, the syndrome weight 134 may be used to determine whether to request a partial soft bit read, which ECC codeword(s) or sub code(s) to request soft bits for, and/or which portions of soft bit data are to be transferred to the controller 120, as illustrative non-limiting examples.

During operation, the data storage device 110 may receive a read command from the access device 150. In particular aspects, the read command may include an address, an amount of data to be read, or both. For example, the read command may indicate that the bits stored in multiple ECC codewords of the word line 113 are to be read. Responsive to the read command, the controller 120 may send a command or instruction to the memory device 112 that causes the read/write circuitry 114 to sense hard bit data corresponding to the multiple ECC codewords of the word line 113. In an illustrative example, the hard bits may be sensed used using one or more state thresholds (e.g., an A state threshold, a B state threshold, etc.), as further described with reference to FIG. 2. Each of the sensed hard bits may be stored in the latches 115, sent from the latches 115 to the memory 122, and provided from the memory 122 to the decoder 124 (e.g., as hard bit data 132).

In a particular aspect, the decoder 124 may determine the syndrome weight 134 based on the hard bit data 132, where the syndrome weight 134 indicates how many errors are expected to be present in the hard bit data 132. Errors may be due to floating gate coupling or other reasons. If the syndrome weight 134 exceeds a threshold, the decoder 124 may elect to request soft bit information to improve decoding of the bits stored in the word line 113.

In some examples, the decoder 124 is configured to support different decoding sequences, where each decoding sequence relies on a different number of soft bits per cell of the word line 113. For example, a 0 soft bit (SB) sequence may correspond to decoding using hard bits without any additional soft bits. A 1 SB sequence may correspond to decoding using one soft bit per cell, a 2 SB sequence may correspond to decoding using two soft bits per cell, etc. As additional soft bits are provided to the decoder, the decoding performance of the decoder 124 may increase. Thus, providing increased soft bits to the decoder 124 may be useful when a bit error rate (BER) of data stored at the memory device 112 increases. However, to determine a soft bit (or additional soft bit) for the cells of the word line 113, an extra sensing operation is performed by the read/write circuitry 114 and an extra toggle out (e.g., transfer) operation is performed to provide the soft bits from the latches 115 to the memory 122. Thus, in some cases, performing soft bit reads can have a noticeable impact in overall throughput at the data storage device 110, especially in situations where the toggle mode frequency of the bus 116 is kept low (e.g., due to cost, power consumption, voltage regulation, and/or electrical load-bearing constraints).

In accordance with the present disclosure, the data storage device 110 supports a partial soft bit read operation, in which less than all soft bits are transferred from the latches 115 to the memory 122. For example, the decoder 124 may initiate decoding of the sub codes that make up the ECC codeword(s) of the word line 113. During the decoding process, the decoder 124 may track the syndrome weight 134 for ECC codewords or for individual sub codes of the ECC codewords. If the syndrome weight 134 exceeds a threshold, the decoder 124 may request a partial soft bit read operation for the corresponding ECC codeword(s), or individual sub code(s) thereof.

A partial soft bit read operation may include a sense operation and a toggle out operation. During the sense operation, the read/write circuitry 114 may sense and store soft bits in the latches 115. In an illustrative example, the read/write circuitry 114 senses a first set of bits based on a first threshold voltage, senses a second set of bits based on a second threshold voltage, and performs a logical operation (e.g., an exclusive NOR (XNOR) operation) on the first set of bits with respect to the second set of bits to determine soft bits to store in the latches 115, as further described with reference to FIG. 2. The first threshold voltage may be determined by decreasing a state threshold voltage by a first offset, and the second threshold voltage may be determined by increasing the state threshold voltage by a second offset (which may be the same as or different than the first offset), as further described with reference to FIG. 2.

During the sense operation, soft bits for all memory cells of the word line 113 may be sensed and stored in the latches 115 (e.g., in parallel). During the toggle out operation, fewer than all of the soft bits are transferred from the latches 115 to the memory 122 via the bus 116. Upon receiving a transferred portion 136 of soft bit data, the decoder 124 may decode the bits stored in the word line 113 based at least in part on the portion 136 of the soft bit data. To illustrate, the decoder 124 may generate data 152 that is provided to the access device 150.

According to a first option (denoted "Option 1"), at least one sub code of soft bit data for each ECC codeword in a subset of multiple ECC codewords is sent to the decoder 124. To illustrate, all sub codes of soft bits may be transferred for certain ECC codewords of the word line 113, and no sub codes of soft bits may be transferred for other ECC codewords of the word line 113, as shown at 126. In FIG. 1, all soft bit sub codes are transferred for half of the ECC codewords in the word line 113. In alternative examples, all soft bit sub codes may be transferred for a different number of ECC codewords in the word line 113 (e.g., for one-quarter of the ECC codewords, three-quarters of the ECC codewords, etc.).

According to a second option (denoted "Option 2"), some, but not all, sub codes of soft bit data for each ECC codeword are transferred from the latches 115 to the memory 122, as shown at 128. In FIG. 1, half of the sub codes of soft bit data for each ECC codeword are transferred. In alternative examples, a different number of sub codes of soft bit data may be transferred (e.g., one-quarter of the sub codes, three-quarters of the sub codes, etc.).

In a particular aspect, after the XNOR operation is performed during the soft bit read, the number of 0s (zeros) may be counted. If the count of the number of 0s exceeds a threshold, the number of cells in an "overlap region" between two different states is high, and partial soft bit information may be transferred to the memory 122 (e.g., in accordance with Option 1 or Option 2). In some examples, the amount of partial soft bit information that is transferred may be based on the number of cells in the overlap region. Thus, in a particular implementation, soft bit information may transferred for an ECC codeword or individual sub code if a corresponding syndrome weight exceeds a first threshold and/or if a corresponding number of cells in an overlap region cells exceeds a second threshold.

In a particular aspect, the decoder 124 may use transferred soft bits to improve performance in determining and adjusting logarithmic likelihood ratios (LLRs) for LDPC decoding. For example, an LDPC ECC decoder may implement an iterative probabilistic decoding process that includes assigning initial probability metrics to each bit in an ECC codeword. The probability metrics may indicate a reliability of each bit (e.g., a likelihood that the bit is not in error). In some aspects, the probability metrics include LLRs that can be obtained from LLR tables stored at or accessible to the LDPC ECC decoder. The LDPC ECC decoder may iteratively determine if a decoded ECC codeword satisfies all parity checks. If all parity checks are not satisfied, the LDPC ECC decoder may adjust the LLRs of one or more bits that are inconsistent with a parity check and perform an additional decoding iteration. Adjusting the LLR of a bit may, in some cases, resulting in flipping the value of the bit (e.g., from 0 to 1 or from 1 to 0). When soft bit data is available, the determination and adjustment of LLRs may be more "accurate" and may converge faster. For example, the soft bit data may enable the LDPC ECC decoder to appropriately "weight" bits having a higher likelihood of being erroneous with respect to bits having a lower likelihood of being erroneous, thereby enabling the LDPC decoder to decode the ECC codeword in fewer iterations.

FIG. 1 thus illustrates a partial soft bit operation in which less than all available soft bit information is transferred from the memory device 112 to the memory 122 of the controller 120. By transferring less than all of the soft bit information (e.g., on an as-needed basis), overall throughput of the data storage device 110 may be increased. The system 100 of FIG. 1 may thus enable meeting performance targets, such as in the case where BER at the data storage device increases to a level where the performance gain achieved by providing the partial soft bit information to the decoder 124 outweighs the performance impact of performing additional sense and toggle out operations to provide the partial soft bit information.

Figure 2:
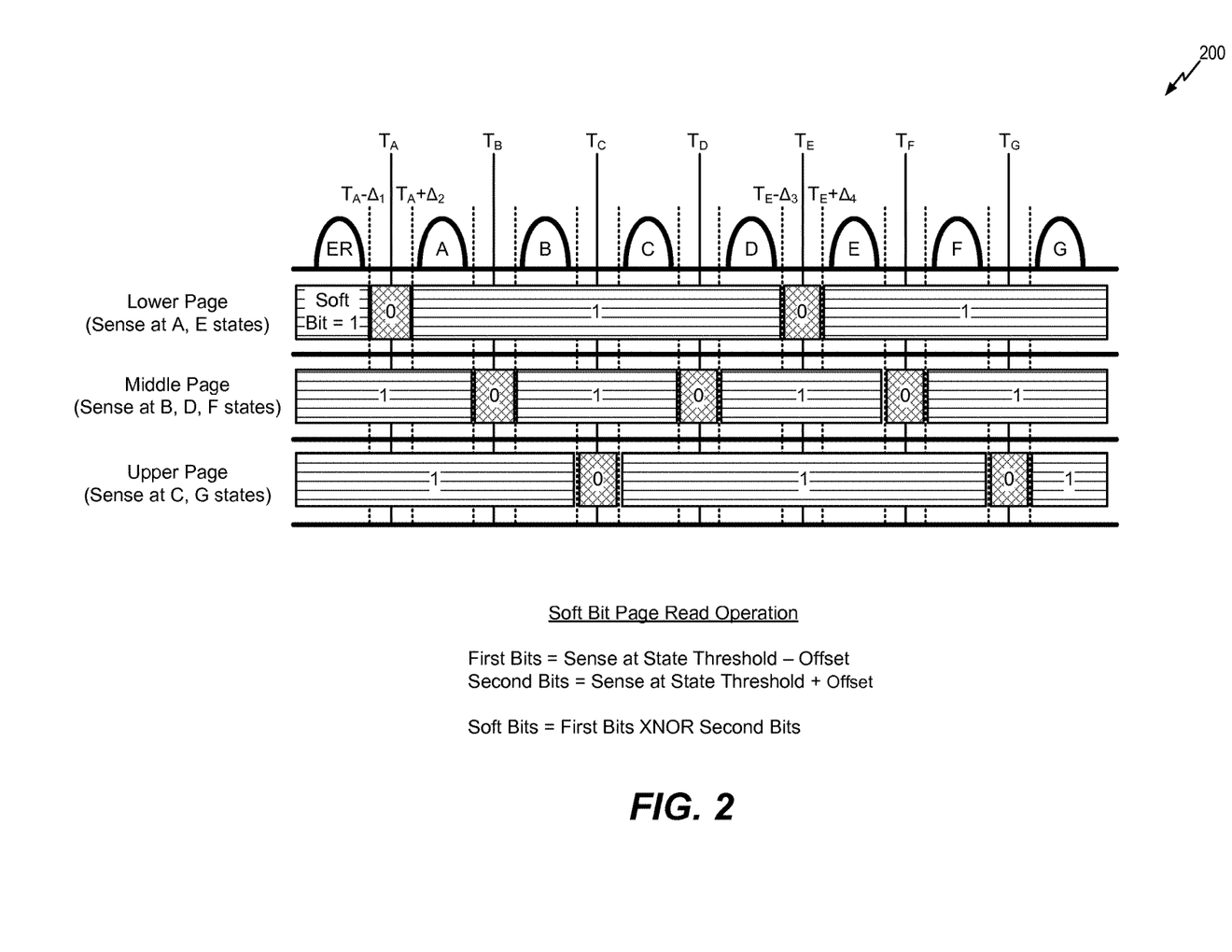
FIG. 2 is a diagram of illustrative sense thresholds that may be used during a partial soft bit read operation.

Referring to FIG. 2, a diagram of illustrative sense thresholds that may be used during a partial soft bit read operation is shown and is generally designated 200. In the example of FIG. 2, each word line (e.g., the word line 113 of FIG. 1) includes three pages: a lower page, a middle page, and an upper page. Cells of the word line may be in an erase (ER) state, an A state, a B state, a C state, a D state, an E state, an F state, or a G state. Examples of voltage distribution curves for each state are illustrated in FIG. 2.

During a hard bit read, cells of the lower page may be sensed using an A state threshold ($T_A$) and an E state threshold ($T_E$). For example, if the sensed voltage for a cell is less than $T_A$, the cell may be determined to be in the erase state. Cells of the middle page may be sensed using a B state threshold ($T_B$), a D state threshold ($T_D$), and an F state threshold ($T_F$). Cells of the upper page may be sensed using a C state threshold ($T_C$) and a G state threshold ($T_G$). Thus, in the example of FIG. 2, a hard bit read operation may generate three pages of hard bits.

During soft bit read, cells of the lower page may be sensed using state voltages plus or minus an offset (e.g., delta ($\Delta$)) value. For example, cells of the lower page may be sensed using $T_A - \Delta_1$ and $T_A + \Delta_2$, and $T_E - \Delta_3$ and $T_E + \Delta_4$. One or more of $\Delta_2$, $\Delta_3$, or $\Delta_4$ may be the same or may be different. The sensed values may be XNOR'd to determine soft bit values. Thus, as shown in FIG. 2, cells in the overlap regions between the ER/A states and the D/E states may have a soft bit value of 0 (zero), and other cells may have a soft bit value of 1 (one). Similarly, during soft bit read, cells of the middle page may be sensed using $T_B+/-$offset(s), $T_D+/-$offset(s), and $T_F+/-$offset(s). Cells of the upper page may be sensed using $T_C+/-$offset(s) and $T_G+/-$offset(s). Thus, in the example of FIG. 2, a soft bit red operation may generate three pages of soft bits. A portion of the soft bits may be transferred to RAM of a controller, as described with reference to FIG. 1.

It should be noted that in some examples, when BER is high, multiple sets of soft bits may be requested. For example, a second set of soft bits may be determined by sensing at state thresholds plus or minus 2Δ, a third set of soft bits may be determined by sensing at state thresholds plus or minus 3Δ, a fourth set of soft bits may be determined by sensing at state thresholds plus or minus 4Δ, etc.

Figure 3:
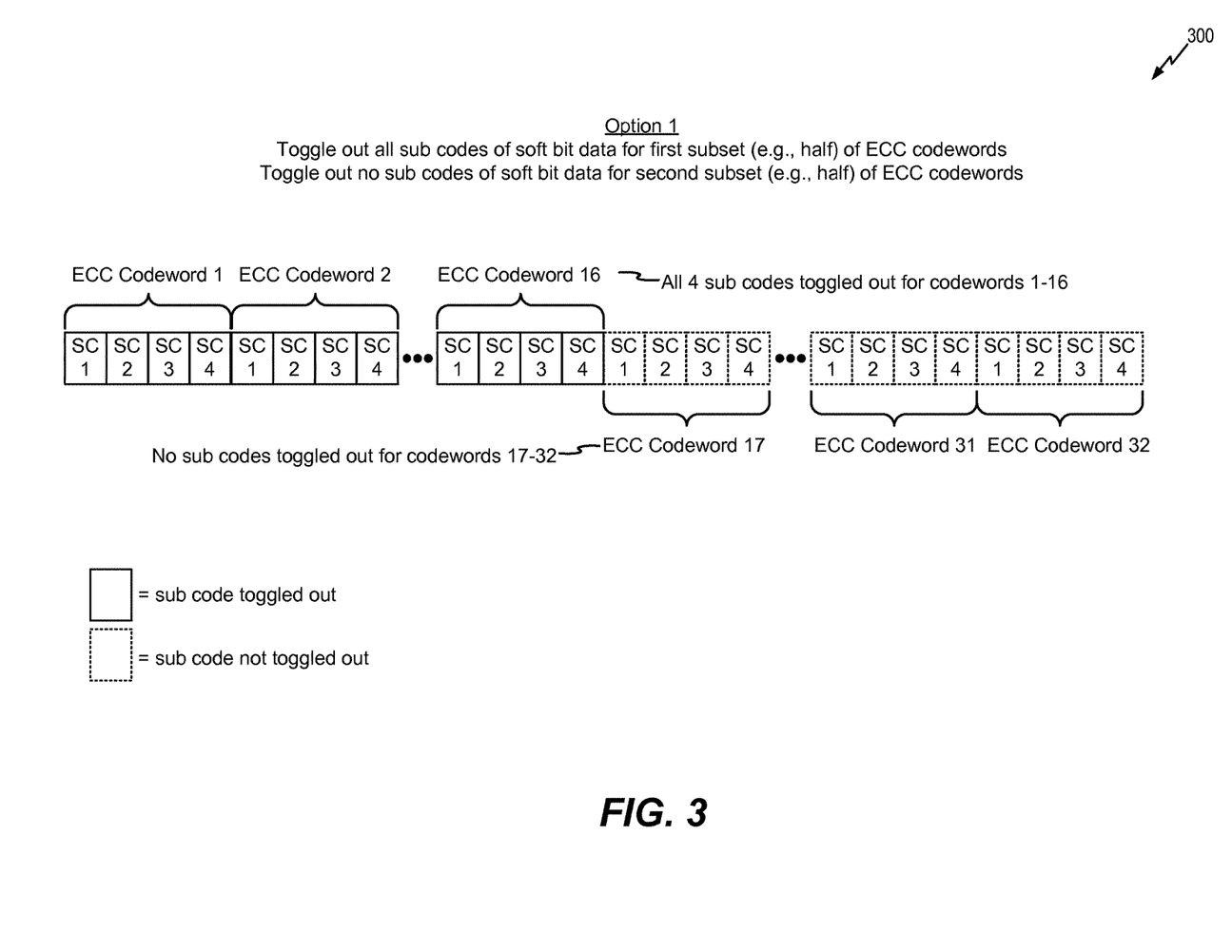
FIG. 3 is a diagram of a first illustrative example of a method of determining a portion of soft bit data.

Referring to FIG. 3, is a diagram of a first illustrative example of determining a portion of soft bit data to transfer during a partial soft bit read operation is shown and is generally designated 300. FIG. 3 corresponds to Option 1 described with reference to FIG. 1. According to Option 1, all sub codes of soft bit data for a first subset (e.g., half) of ECC codewords are toggled out, and no sub codes of soft bit data for a second subset (e.g., half) of ECC codewords are toggled out.

In the example of FIG. 3, thirty-two ECC codewords are shown, where each ECC codeword has four sub codes. Thus, in accordance with Option 1, soft bits for all four sub codes are toggled out for ECC codewords 1-16, and no soft bits for any sub code are toggled out for ECC codewords 17-32.

Figure 4:
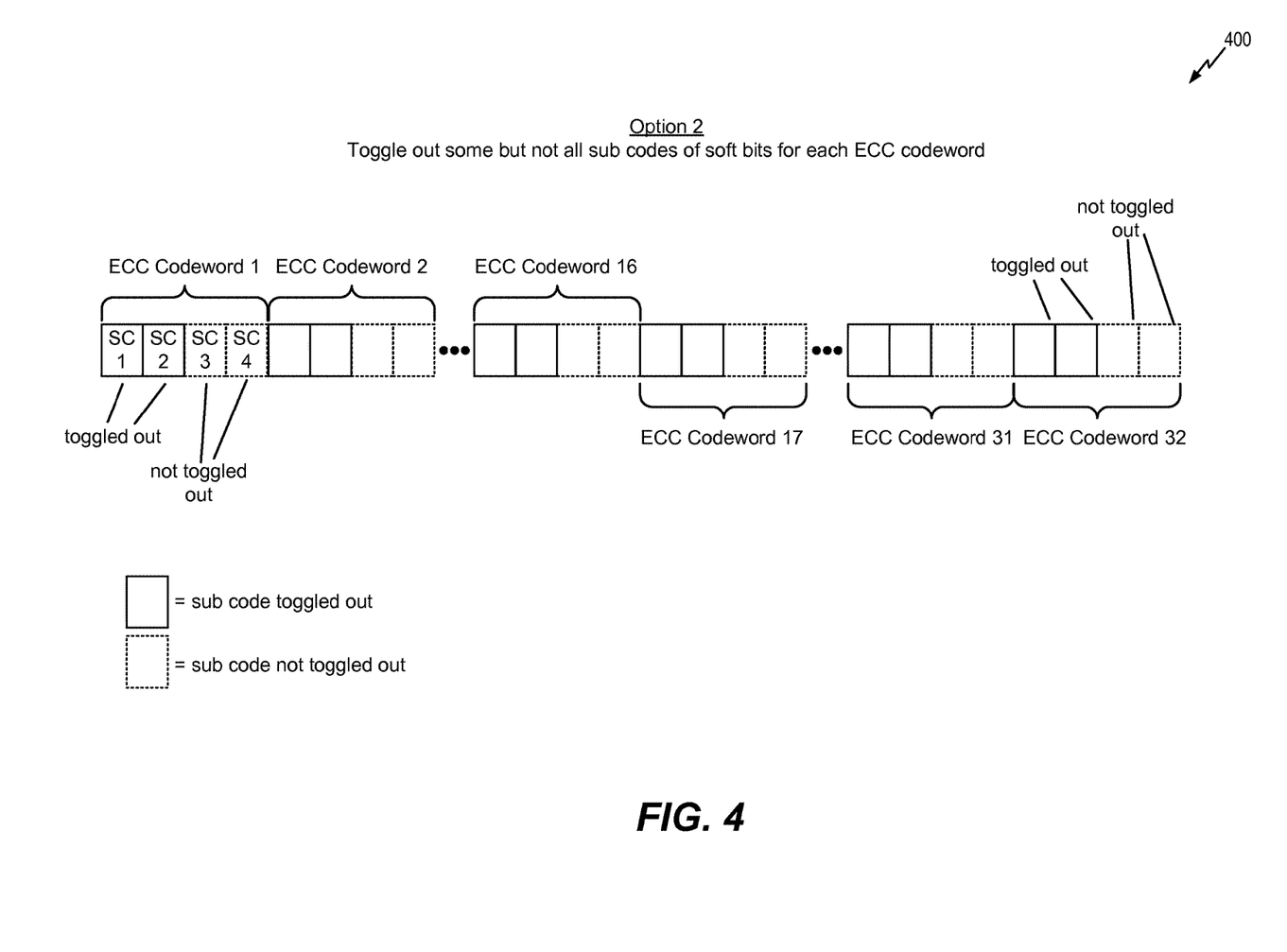
FIG. 4 is a diagram of a second illustrative example of a method of determining a portion of soft bit data.

Referring to FIG. 4, is a diagram of a second illustrative example of determining soft bit data to transfer during a partial soft bit read operation is shown and is generally designated 400. FIG. 4 corresponds to Option 2 described with reference to FIG. 1. According to Option 2, some but not all sub codes (e.g., half of the sub codes) of soft bits are toggled out for each ECC codeword.

In the example of FIG. 4, thirty-two ECC codewords are shown, where each ECC codeword has first number of sub codes (e.g., 4 sub codes). Thus, in accordance with Option 1, soft bits for a second number of sub codes (e.g., 2 sub codes) are toggled out for each of ECC codewords 1-32, where the second number is less than the first number. In a particular aspect, to toggle out soft bits for fewer than all sub codes, a column skip command is performed when toggling data out of latches (e.g., the latches 115 of FIG. 1).

Figure 5:
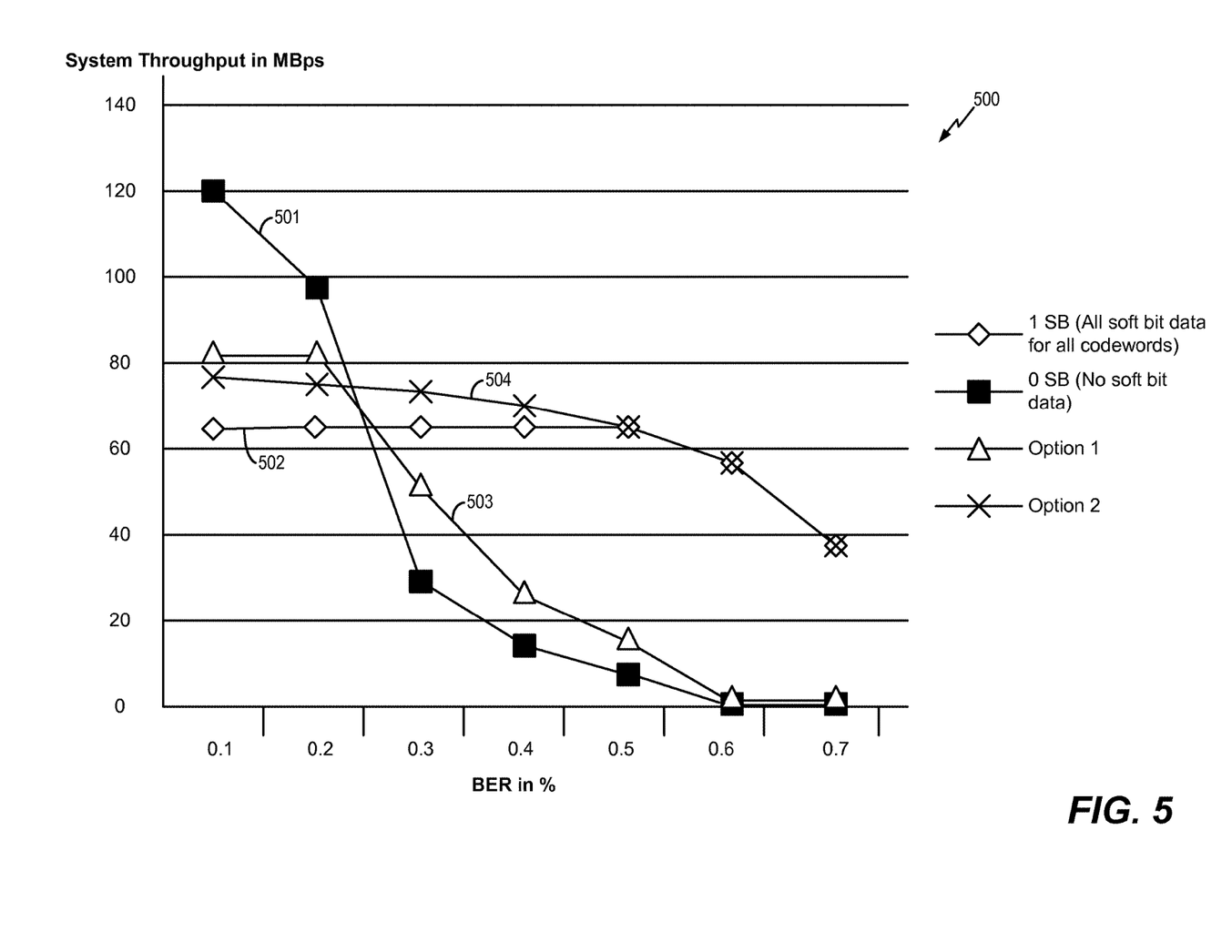
FIG. 5 is diagram that illustrates variations in throughput of a memory system with respect to bit error rate (BER) at the memory system.

FIG. 5 depicts a graph 500 illustrating variations in effective system throughput vs. bit error rate (BER) during a partial soft bit read operation. For example, the graph 500 may correspond to performance with a toggle mode frequency of 166 megahertz (MHz) and a LDPC clock of 166 MHz. The specific values of throughput in megabytes per second (MBps) and BER (in percent) shown in FIG. 5 are illustrative only, and are not to be considered limiting.

The graph 500 includes a curve 501 corresponding to system throughput for 0 SB decoding, in which no soft bits are transferred from memory to the controller, and a curve 502 corresponding to system throughput for 1 SB decoding, in which a soft bit for each cell of each sub code of each ECC codeword is transferred from the memory to the controller. When BER is low (e.g., less than 0.3%), throughput for 0 SB may be higher than throughput for 1 SB, as shown. For example, at low BER, the LDPC ECC decoder may quickly decode data based on hard bits in the 0 SB case, and the additional sense/toggle operations for the 1 SB case may decrease overall throughput. As BER increases, throughput for the 0 SB case may decrease to below the throughput for the 1 SB case, because the availability of soft bits in the 1 SB case may improve throughput. It is noted that the curve 502 for the 1 SB case is relatively flat for BER between 0.1% and 0.5%, indicating that the bottleneck at these BERs is the additional sense/toggle out operation rather than decoding operations within the LDPC ECC decoder.

The graph 500 also includes a curve 503 corresponding to system throughput for Option 1 described with reference to FIGS. 1 and 3, and a curve 504 corresponding to system throughput for Option 2, described with reference to FIGS. 1 and 4. Option 1 can be considered as performing SB 0 (no soft bits transferred) for half of the codewords and SB 1 (all soft bits transferred) for the other half of the codewords. Thus, for Option 1, overall throughput can be determined based on an average of decode latencies of SB 0 and SB 1. In Option 1, decode performance may be reduced for the codewords having no transferred soft bits. For Option 2, the throughput may be determined based on a function of SB 0 and SB 1 throughput. When half of the soft bits are transferred for each codeword, the throughput may be an average of the SB 0 and SB 1 throughputs.

At lower BER, Option 1 may provide higher throughput than Option 2, as shown in the graph 500. As BER increases, however, Option 2 may provide higher throughput due to the presence of at least partial soft bit information available for each sub code. For memory systems where the average BER is between 0.3% and 0.5%, Option 2 may be preferable to Option 1.

In an illustrative aspect, partial soft bit read as described herein can be implemented in a removable memory system. In removable memory systems, data transfer between the memory and the controller may be relatively slow. It may thus be advantageous to transfer a small amount of soft bit information (e.g., according to Option 1 or Option 2). If decoding fails, additional soft bit information can be transferred. Alternatively, or in addition, partial soft bit read as described herein may be implemented in an enterprise storage system. Enterprise storage systems may include a large number of memory dies, and a word line or page may be striped across the memory dies. When soft bits are requested for particular codewords or particular sub codes rather than for an entire word line or page, fewer than all of the memory dies may be accessed. Accessing fewer memory dies may improve throughput, for example by avoiding a page stripe operation to access all memory cells of the word line or page.

Figure 6:
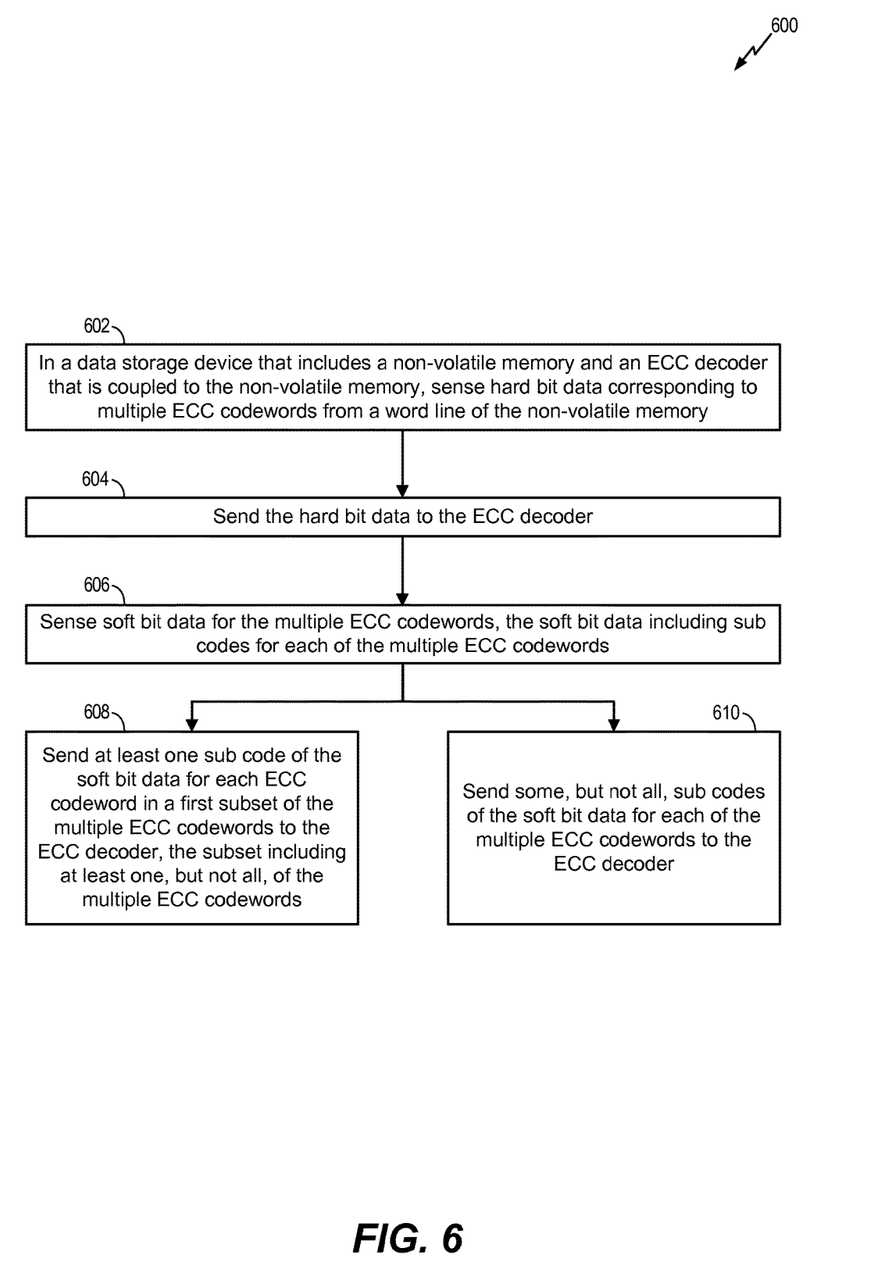
FIG. 6 is a flowchart that illustrates a particular example of a method of performing a partial soft bit read operation.

Referring to FIG. 6, a particular illustrative example of a method is depicted and generally designated 600. In an illustrative example, the method 600 may be performed at the data storage device 110 of FIG. 1.

The method 600 may include, in a data storage device that includes a non-volatile memory and an ECC decoder that is coupled to the non-volatile memory, sensing hard bit data corresponding to multiple ECC codewords from a word line of the non-volatile memory, at 602, and sending the hard bit data to the ECC decoder, at 604. For example, referring to FIG. 1, the read/write circuitry 114 may sense hard bits for the ECC codewords of the word line 113 and store the hard bits in the latches 115. In an illustrative aspect, the hard bits are sensed using one or more of the state thresholds illustrated in FIG. 2. The hard bits may be transferred from the latches 115 to the memory 122 (e.g., RAM). The hard bits may be provided from the memory 122 to the decoder 124 for use in decoding operations.

The method 600 may further include performing a partial soft bit read, including sensing soft bit data for the multiple ECC codewords, at 606. The sensed soft bit data may include sub codes for each of the multiple ECC codewords. For example, referring to FIG. 1, the read/write circuitry 114 may sense soft bits for the ECC codewords of the word line 113 and store the soft bits in the latches 115. In an illustrative aspect, the soft bits are determined using one or more of the +/−offset thresholds illustrated in FIG. 2.

According to a first option, the method 600 may include sending at least one sub code of the soft bit data for each ECC codeword in a first subset of the multiple ECC codewords to the ECC decoder, at 608. The subset may include at least one, but not all, of the multiple ECC codewords. Alternatively, according to a second option, the method 600 may include sending some, but not all, sub codes of the soft bit data for each of the multiple ECC codewords to the ECC decoder. To illustrate, a portion of the sensed soft bits may be transferred from the latches 115 to the memory 122 (e.g., RAM). The transferred portion of the soft bits may be provided from the memory 122 to the decoder 124 for use in decoding operations. In an illustrative aspect, the portion of the soft bits that are to be transferred from the latches 115 to the memory 122 may be determined based on Option 1 or Option 2 described with reference to FIGS. 1, 3, and 4.

Figure 7:
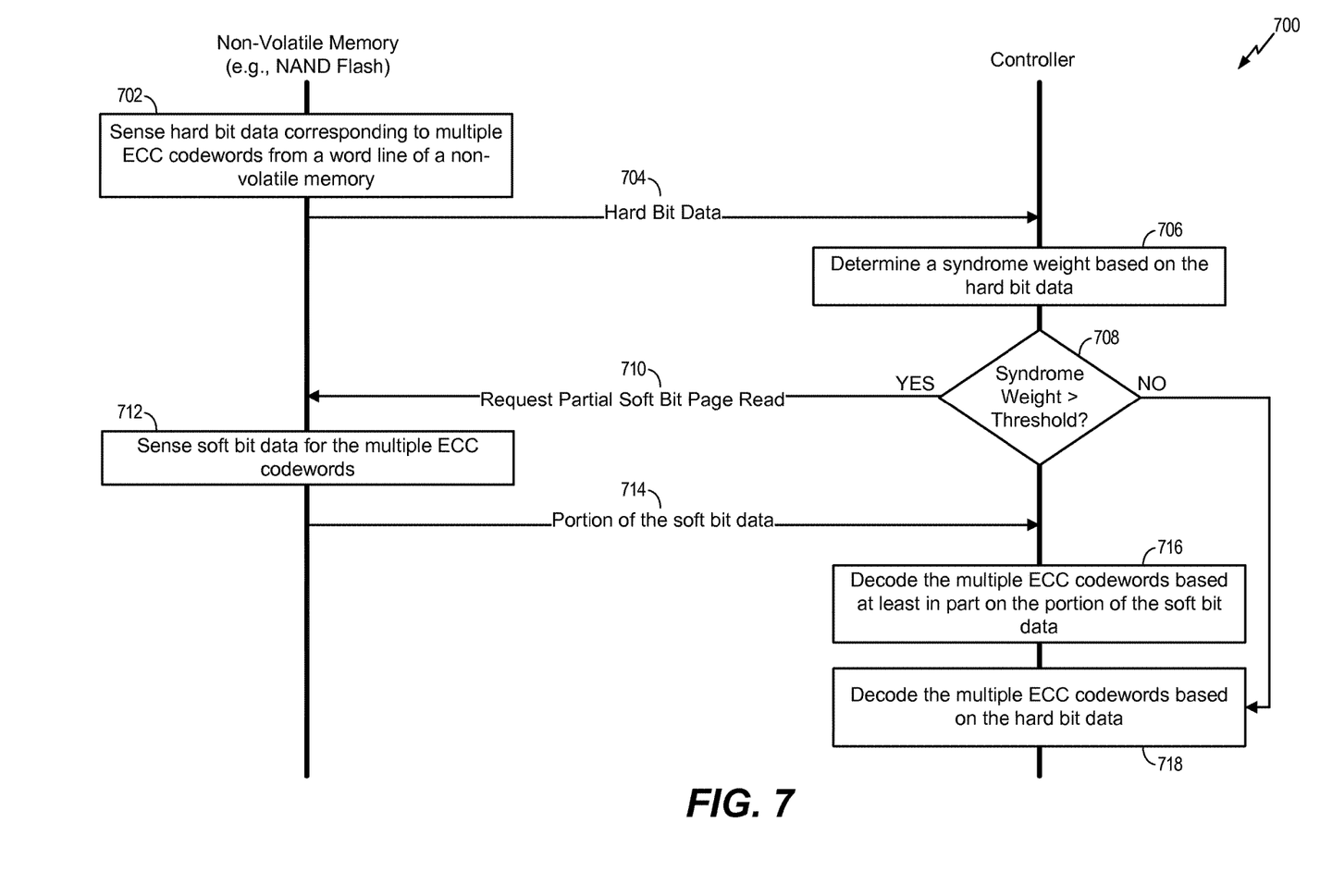
FIG. 7 is a flowchart that illustrates another particular example of a method of performing a partial soft bit read operation.

Referring to FIG. 7, a particular illustrative example of a method is depicted and generally designated 700. In an illustrative example, the method 700 may be performed at the data storage device 110 of FIG. 1. In FIG. 7, operations performed at non-volatile memory (e.g., the memory device 112) are shown on the left and operations performed at a controller (e.g., the controller 120) are shown on the right.

At 702, hard bit data corresponding to multiple ECC codewords may be sensed from a word line of the non-volatile memory. Continuing to 704, the hard bit data may be sent from the non-volatile memory to the controller. For example, referring to FIG. 1, the hard bit data 132 may be transferred to the memory 122 of the controller 120. In a particular example, all sensed hard bits for all ECC codewords of a word line are transferred to the controller 120.

Advancing to 706, a syndrome weight may be determined at the controller based on the received hard bit data. The syndrome weight may be for the multiple ECC codewords, a subset of the multiple ECC codewords, a single ECC codeword, one or more sub codes of one or more ECC codewords, etc. At 708, the syndrome weight may be compared to a threshold. If the syndrome weight exceeds a threshold, a partial soft bit page read may be requested, at 710. For example, if the syndrome weight for a particular sub code exceeds a threshold, a partial soft bit page read may be requested, where the partial soft bit page read indicates that some or all soft bits for the particular sub code are to be transferred to the controller. If the syndrome weight does not exceed the threshold, the multiple ECC codewords may be decoded based on the hard bit data (without using soft bits), at 718. For example, referring to FIG. 1, if the syndrome weight 134 exceeds a threshold, the decoder 124 may request a partial soft bit page read; otherwise the decoder 124 may use the hard bit data 132 for decoding.

When the partial soft bit page read is requested, soft bit data may be sensed for the multiple ECC codewords, at 712, and a portion of the soft bit data may be sent to the controller, at 714. For example, referring to FIG. 1, the portion 136 of soft bit data may be transferred to the controller 120. The portion of the soft bit data may omit at least one soft bit that was sensed (at 712). For example, according to Option 1 described with reference to FIGS. 1 and 3, all available sub codes of soft bit data may be transferred for a subset of the ECC codewords, while none of the available sub codes of soft bit data are transferred for the rest of the ECC codewords. As another example, according to Option 2 described with reference to FIGS. 1 and 4, some, but not all, of the available sub codes of soft bit data may be transferred for each of the ECC codewords. In some examples, how many sub codes of soft bit data are to be transferred, specific sub codes of soft bit data are to be transferred, sub codes for which ECC codewords are to be transferred, etc. can be indicated in the request for the partial soft bit page read operation sent by the controller (at 710). Continuing to 716, the multiple ECC codewords may be decoded based at least in part on the requested portion of the soft bit data.

Although FIG. 7 illustrates a request for a partial soft bit read, in alternative examples, both the hard bits and the portion of the soft bits may be sensed and sent to the controller responsive to the same read command.

Various operations described herein, such as the methods of FIGS. 6-7 (or portions thereof), may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, such operations can be initiated or controlled by one or more processors, such as one or more processors included in or coupled to the controller 120 or the memory device 112 of the data storage device 110 and/or the access device 150 of FIG. 1. Additionally, in particular aspects, one or more operations described herein may be optional, may be performed at least partially concurrently, and/or may be performed in a different order than shown or described.

In a particular aspect, a non-volatile memory system suitable for use in implementing aspects of the disclosure may be coupled to an access device. The non-volatile memory system includes a controller and a non-volatile memory that is made up of one or more non-volatile memory dies. As used herein, the term "memory die" refers to the collection of non-volatile memory cells, and associated circuitry for managing the physical operation of those non-volatile memory cells, that are formed on a single semiconductor substrate. The controller interfaces with the access device and transmits command sequences for read, program, and erase operations to the one or more non-volatile memory dies. The controller and the non-volatile memory may be configured to support a partial soft bit read operation, as described with reference to FIGS. 1-7.

The controller, which may be a flash memory controller, can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller can be configured with hardware and/or firmware to perform various functions as described herein. Further, some of the components shown in the drawings as being internal to a controller can instead be external to the controller, and/or other components can be used. Additionally, the phrase "operatively in communication with" can mean directly in communication with or indirectly (wired or wireless) in communication with through one or more components, which may or may not be shown or described.

As used herein, a flash memory controller is a device that manages data stored on flash memory and communicates with an access device, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when an access device is to read data from or write data to the flash memory, the host device communicates with the flash memory controller. If the host device provides a logical address (e.g., LBA) to which data is to be read/written, the flash memory controller can convert the logical address received from the host device to a physical address in the flash memory. Alternatively, the host device can provide the physical address. The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller and the one or more non-volatile memory dies may be any suitable flash interface, such as Toggle Mode 200, 400, or 800. In one example, the present disclosure may be implemented in a card based system, such as a card that supports universal flash storage (UFS). In an alternate example, the present disclosure is implemented as part of an embedded memory system.

It is to be noted that the present disclosure is not to be limited to a single channel between the controller and the one or more non-volatile memory dies. For example, in some NAND memory system architectures, 2, 4, 8 or more NAND channels may exist between the controller and the NAND memory device, depending on controller capabilities. Thus, in any of the examples described herein, more than a single channel may exist between the controller and the one or more non-volatile memory dies, even if a single channel is shown in the drawings.

In some aspects, a storage module used to implement the techniques of the present disclosure includes multiple non-volatile memory systems. As such, the storage module may include a storage controller that interfaces with an access device and with a storage system that includes a plurality of non-volatile memory systems. The interface between the storage controller and the non-volatile memory systems may be a bus interface, such as a PCIe interface, as an illustrative non-limiting example. The storage module may correspond to a SSD device, such as found in portable computing devices, such as laptop computers, and tablet computers. Each storage controller of the storage module may be configured to support a partial soft bit read operation, as described with reference to FIGS. 1-7.

In some aspects, the techniques of the present disclosure are incorporated into a hierarchical storage system that includes a plurality of storage controllers, each of which controls a respective storage system. Host systems (e.g., one or more host devices or access devices) may access memories within the hierarchical storage system via a bus interface. In one example, the bus interface may be a NVMe or fiber channel over Ethernet (FCoE) interface. In one example, the hierarchical storage system may be a rack mountable mass storage system that is accessible by multiple host computers, such as would be found in a data center or other location where mass storage is utilized. Each storage controller of the hierarchical storage system may be configured to support a partial soft bit read operation, as described with reference to FIGS. 1-7.

It is to be understood that a controller, such as the controller 120 of FIG. 1, may include more, fewer, and/or different components than shown. For example, in some aspects, a controller includes a front end module that interfaces with an access device, a back end module that interfaces with the one or more non-volatile memory dies, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

The controller may also include a buffer manager/bus controller that manages buffers in random access memory (RAM) and controls the internal bus arbitration of the controller. A read only memory (ROM) of the controller may store system boot code. In other examples one or both of the RAM and the ROM may be located externally to the controller. In yet other examples, portions of RAM and ROM may be located both within the controller and outside the controller.

The controller may also include a front end module including a host interface and a physical layer interface (PHY) that provide the electrical interface with the host device or next level storage controller. The choice of the type of host interface can depend on the type of memory being used. Examples of host interfaces include, but are not limited to, SCSI, Fibre Channel, PCIe, and NVMe. The host interface typically facilitates transfer for data, control signals, and timing signals.

The back end module can include an ECC engine (e.g., a LDPC ECC engine) that encodes the data received from the host device, and decodes and error corrects the data read from the non-volatile memory. A command sequencer may generate command sequences, such as program and erase command sequences, to be transmitted to the one or more non-volatile memory dies. A Redundant Array of Independent Drives (RAID) module may manage generation of RAID parity and recovery of failed data. The RAID parity may be used as an additional level of integrity protection for the data being written into the one or more non-volatile memory dies. In some cases, the RAID module may be a part of the ECC engine. A memory interface may provide the command sequences to the one or more non-volatile memory die and may receive status information from the one or more non-volatile memory dies. For example, the memory interface may be a double data rate (DDR) interface, such as a Toggle Mode 200, 400, or 800 interface. A flash control layer may control the overall operation of the back end module. In some examples, the back end module is configured to support a partial soft bit read operation, as described with reference to FIGS. 1-7.

A storage system may also include a power management module and a media management layer, which performs wear leveling of memory cells of the one or more non-volatile memory dies. Other discrete components, such as external electrical interfaces, external RAM, resistors, capacitors, or other components that may interface with the controller may also be included. In alternative examples, one or more of the PHY interface, the RAID module, the media management layer, and the buffer management/bus controller are optional components that are omitted from the controller.

Non-volatile memory dies may also include more, fewer, and/or different components than shown in FIG. 1. For example, non-volatile memory dies can include peripheral circuitry and a non-volatile memory array including non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry may include a state machine that provides status information to the controller. The peripheral circuitry may also include a power management or data latch control module. The one or more non-volatile memory dies may further include discrete components (as described above), an address decoder, an address decoder, and a data cache that caches data.

Although various components depicted herein are illustrated as block components and described in general terms, such components may include one or more microprocessors, state machines, or other circuits configured to enable a partial soft bit read operation, as described with reference to FIGS. 1-7. For example, components illustrated in FIG. 1 may represent physical components, such as hardware controllers, state machines, logic circuits, or other structures.

In some examples, a partial soft bit read operation may be implemented using a microprocessor or microcontroller programmed to operate as described herein. In a particular example, a processor executing instructions (e.g., firmware) that are stored at a non-volatile memory (e.g., the memory device 112 or the memory 122 of the controller 120) may perform a partial soft bit read operation. Alternatively, or in addition, executable instructions that are executed by the processor may be stored at a separate memory location, such as at a ROM.

In a particular example, the data storage device 110 may be implemented in a portable device configured to be selectively coupled to one or more external devices. However, in other examples, the data storage device 110 may be attached or embedded within one or more host devices, such as within a housing of a host communication device. For example, the data storage device 110 may be within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory. In other implementations, the data storage device 110 may be implemented in a portable device configured to be selectively coupled to one or more external access devices. In still other implementations, the data storage device 110 may be a component (e.g., a solid-state drive (SSD)) of a network accessible data storage system, such as an enterprise data system, a network-attached storage system, a cloud data storage system, etc.

To further illustrate, the data storage device 110 may be configured to be coupled to the access device 150 as embedded memory, such as in connection with an embedded MultiMedia Card (eMMC®) (trademark of JEDEC Solid State Technology Association, Arlington, Va.) configuration, as an illustrative example. The data storage device 110 may correspond to an eMMC device. As another example, the data storage device 110 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 110 may operate in compliance with a JEDEC industry specification. For example, the data storage device 110 may operate in compliance with a JEDEC eMMC specification, a JEDEC Universal Flash Storage (UFS) specification, one or more other specifications, or a combination thereof. In yet another particular implementation, the data storage device 110 is coupled to the access device 150 indirectly, e.g., via a network. For example, the data storage device 110 may be a network-attached storage (NAS) device or a component (e.g., a solid-state drive (SSD) device) of a data center storage system, an enterprise storage system, or a storage area network.

In a particular example, the memory device 112 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory. In some aspects, the memory device 112 may include a semiconductor memory device. Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the examples described herein are intended to provide a general understanding of the various implementations. Other examples or implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

In accordance with a particular aspect of the present disclosure, a data storage device includes a non-volatile memory and a controller coupled to the non-volatile memory. The controller includes an ECC decoder. The non-volatile memory is configured to sense hard bit data and soft bit data corresponding to multiple ECC codewords from a word line of the non-volatile memory. The soft bit data includes sub codes for each of the multiple ECC codewords. The non-volatile memory is configured to send at least one sub code of the soft bit data for each ECC codeword in a subset of the multiple ECC codewords to the ECC decoder, the subset including at least one, but not all, of the multiple ECC codewords.

In accordance with another aspect of the present disclosure, a data storage device includes a non-volatile memory and a controller coupled to the non-volatile memory. The controller includes an ECC decoder. The non-volatile memory is configured to sense hard bit data and soft bit data corresponding to multiple ECC codewords from a word line of the non-volatile memory. The soft bit data includes sub codes for each of the multiple ECC codewords. The non-volatile memory is configured to send some, but not all, sub codes of the soft bit data for each of the multiple ECC codewords to the ECC decoder.

In accordance with another aspect of the present disclosure, a method performed by a non-volatile memory in a device includes sensing hard bit data corresponding to multiple ECC codewords from a word line of the non-volatile memory and sending the hard bit data to an ECC decoder. The method also includes receiving, based at least in part on a syndrome weight associated with the hard bit data, a request for one or more sub codes of soft bit data corresponding to one or more of the multiple ECC codewords. The method further includes sensing soft bit data for the multiple ECC codewords and sending the requested one or more sub codes of the soft bit data to the ECC decoder.

The illustrations of the embodiments, aspects, and examples described herein are intended to provide a general understanding of the various embodiments, aspects, and examples. Other embodiments, aspects, and examples may be utilized and derived from the disclosure, such that structural and logical substitutions and changes may be made without departing from the scope of the disclosure. This disclosure is intended to cover any and all subsequent adaptations or variations of various embodiments, aspects, and examples.

The above-disclosed subject matter is to be considered illustrative, and not restrictive, and the appended claims are intended to cover all such modifications, enhancements, and other embodiments, aspects, and examples, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
   a controller that includes an error correction coding (ECC) decoder;
   a non-volatile memory coupled to the controller, the non-volatile memory configured to sense hard bit data and soft bit data corresponding to multiple ECC codewords from a word line of the non-volatile memory, the soft bit data including sub codes for each of the multiple ECC codewords, wherein the multiple ECC codewords include joint parity information associated with the sub codes; and
   a plurality of latches coupled to the non-volatile memory, wherein the controller is configured to enable the non-volatile memory to provide the soft bit data to the plurality of latches, and wherein the controller is further configured to receive a portion of the soft bit data from the plurality of latches, the portion of the soft bit data including less than all of the soft bit data and corresponding to at least one sub code of the soft bit data for each ECC codeword in a subset of the multiple ECC codewords, the subset including at least one, but not all, of the multiple ECC codewords.

2. The data storage device of claim 1, further comprising a bus coupled to the non-volatile memory and to the controller.

3. The data storage device of claim 1, wherein the controller further includes a random access memory (RAM) coupled to the ECC decoder and configured to store the at least one sub code of the soft bit data.

4. The data storage device of claim 1, wherein the subset corresponds to one-quarter of the multiple ECC codewords, half of the multiple ECC codewords, or three-quarters of the multiple ECC codewords.

5. The data storage device of claim 1, wherein the non-volatile memory is further configured to, during the sensing of the soft bit data for the multiple ECC codewords, sense a first set of bits based on comparison to a first threshold voltage and a second set of bits based on a comparison to a second threshold voltage.

6. The data storage device of claim 5, wherein the non-volatile memory is further configured to generate the soft bit data based on performing an exclusive nor (XNOR) operation on the first set of bits with respect to the second set of bits.

7. The data storage device of claim 5, wherein the first threshold voltage is determined by decreasing a state threshold voltage by a first offset, and wherein the second threshold voltage is determined by increasing the state threshold voltage by a second offset.

8. The data storage device of claim 7, wherein the state threshold voltage is used to sense the hard bit data corresponding to the multiple ECC codewords.

9. The data storage device of claim 1, wherein the non-volatile memory is further configured to send, to the ECC decoder for at least one ECC codeword, each sub code of the hard bit data and less than each sub code of the soft bit data for the at least one ECC codeword.

10. The data storage device of claim 1, wherein the non-volatile memory is further configured to send no sub code of soft bit data to the ECC decoder for at least one of the multiple ECC codewords.

11. The data storage device of claim 1, wherein each of the sub codes corresponds to a granularity associated with the ECC decoder.

12. The data storage device of claim 1, wherein the controller is further configured to initiate a sense operation of a read process to enable the non-volatile memory to provide the soft bit data to the plurality of latches, and wherein the controller is further configured to initiate a toggle out operation of the read process to receive the portion of the soft bit data from the plurality of latches.

13. The data storage device of claim 1, wherein the controller is further configured to execute a column skip command to receive the portion of the soft bit data from the plurality of latches.

14. The data storage device of claim 1, wherein the ECC decoder is configured to decode the hard bit data using the portion of the soft bit data.

15. A method comprising:
   sensing a plurality of hard bits corresponding to a plurality of pages stored at a region of a non-volatile memory of a data storage device;
   sending the plurality of hard bits to an error correction coding (ECC) engine of the data storage device;
   sensing a plurality of soft bits corresponding to the plurality of pages stored at the region of the non-volatile memory;
   storing the plurality of soft bits at a plurality of latches of the data storage device; and
   for each page of a subset of the plurality of pages, sending at least one sub code of the plurality of soft bits to the ECC engine, the at least one sub code corresponding to a portion of the plurality of soft bits and including fewer than all of the plurality of soft bits, wherein each page of the subset includes joint parity information associated with the at least one sub code, the subset including at least one, but not all, of the plurality of pages.

16. The method of claim 15, wherein the subset corresponds to one-quarter of the plurality of pages, half of the plurality of pages, or three-quarters of the plurality of pages.

17. The method of claim 15, wherein sensing the plurality of soft bits includes generating a first set of bits based on a first threshold voltage and further includes generating a second set of bits based on a second threshold voltage.

18. The method of claim 17, wherein sensing the plurality of soft bits further includes performing an exclusive nor (XNOR) operation using the first set of bits and the second set of bits.

19. The method of claim 17, further comprising:
determining the first threshold voltage by decreasing a state threshold voltage by a first offset; and
determining the second threshold voltage by increasing the state threshold voltage by a second offset, wherein the state threshold voltage is used to sense the plurality of hard bits.

20. An apparatus comprising:
means for storing multiple ECC codewords, for generating hard bit information corresponding to the multiple ECC codewords, and for generating soft bit information including sub codes for each of the multiple ECC codewords, the multiple ECC codewords including joint parity information associated with the sub codes;
means for latching the soft bit information; and
means for decoding the hard bit information and for receiving a portion of the soft bit information from the means for latching, the portion of the soft bit information including less than all of the soft bit information and corresponding to, for each ECC codeword in a subset of the multiple ECC codewords, at least one sub code of the soft bit information, the subset including at least one, but not all, of the multiple ECC codewords.

21. The apparatus of claim 20, further comprising means for controlling memory access operations at the means for storing, wherein the means for controlling includes the means for decoding.

* * * * *